United States Patent
Okamura

[11] Patent Number: 6,037,637
[45] Date of Patent: *Mar. 14, 2000

[54] BICMOS LOGICAL INTEGRATED CIRCUIT

[75] Inventor: Hitoshi Okamura, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/626,071

[22] Filed: Apr. 1, 1996

[30] Foreign Application Priority Data

Mar. 30, 1995 [JP] Japan .................................. 7-073098

[51] Int. Cl.[7] .................................................. H01L 29/76
[52] U.S. Cl. ........................................................ 257/370
[58] Field of Search ............................................. 257/370

[56] References Cited

U.S. PATENT DOCUMENTS

| | | | |
|---|---|---|---|
| 5,059,821 | 10/1991 | Muabayashi et al. | 307/360 |
| 5,107,147 | 4/1992 | Yee et al. | 307/465.1 |
| 5,332,933 | 7/1994 | Raje | 307/446 |
| 5,604,417 | 2/1997 | Kaminaga et al. | 320/17 |

FOREIGN PATENT DOCUMENTS

| | | |
|---|---|---|
| 0 498 567 A1 | 8/1992 | European Pat. Off. . |
| 0 645 890 A2 | 3/1995 | European Pat. Off. . |
| 60-60765 | 4/1985 | Japan . |
| 63-43345 | 2/1988 | Japan . |
| 1-256148 | 10/1989 | Japan . |
| 3-46254 | 2/1991 | Japan . |
| 3-217055 | 9/1991 | Japan . |
| 5-145023 | 11/1991 | Japan . |
| 3-295314 | 12/1991 | Japan . |
| 4-380471 | 10/1992 | Japan . |
| 4-355957 | 12/1992 | Japan . |
| 5-75082 | 3/1993 | Japan . |
| 5145023 | 6/1993 | Japan .................................. 257/370 |
| 5-335499 | 12/1993 | Japan . |
| 6-112798 | 4/1994 | Japan . |
| 6-216251 | 8/1994 | Japan . |
| 7-95045 | 4/1995 | Japan . |
| 7-288463 | 10/1995 | Japan . |

OTHER PUBLICATIONS

"Analysis and Design of Digital Integrated Circuits" Hodges and Jackson, p. 89, 1988.

Japanese Office Action dated Aug. 19, 1997 with English language translation of Japanese Examiner's comments.

Japanese Office Action dated Mar. 16, 1998 with English language translation of Japanese Examiner's comments.

Abbas El Gamal, et al., "BiNMOS: A Basic Cell for BiCMOS Sea–of–Gates," Processing of IEEE 1989 Custom Integrated Circuits Conference, pp. 8.3.1–8.3.4, 1989.

*Primary Examiner*—Olik Chaudhuri
*Assistant Examiner*—Douglas A. Wille
*Attorney, Agent, or Firm*—Whitham, Curtis & Whitham

[57] ABSTRACT

In a semiconductor integrated circuit device wherein a BiCMOS logical gate circuit and a CMOS logical gate circuit are used in combination, a lower power consumption than that of CMOS and a higher integration density than that of CMOS are realized without sacrificing the operating speed. The BiCMOS semiconductor integrated circuit device of the present invention is realized by logical function macros using the output portion, of logical function realized by a CMOS gate constituted by an MOS transistor having a gate width determined by the minimum value in the design criteria, as a BiCMOS buffer having a very small input capacity. In the BiCMOS buffer, the gate width of the MOS transistor, wherein a gate is connected to the input terminal, is set at a small value by incorporation of a base potential clamp circuit or the like.

13 Claims, 7 Drawing Sheets

25 CMOS LOGIC GATE 25  26 BICMOS LOGIC GATE

12 SECOND RESISTANCE ELEMENT
11 FIRST RESISTANCE ELEMENT
30 TERMINAL TO BE VOLTAGE-CLAMPED
13 THIRD RESISTANCE ELEMENT
10 NPN BI-POLAR TRANSISTOR
14 CAPACITY

12 SECOND RESISTANCE ELEMENT

16 DIODE

BICMOS LOGICAL INTEGRATED CIRCUIT

FIELD OF THE INVENTION

The present invention relates to a semiconductor integrated circuit, and particularly to a BiCMOS logical integrated circuit wherein a bipolar transistor and an MOS transistor are integrated on an identical semiconductor substrate and a CMOS logical gate circuit and a BiCMOS logical gate circuit are allowed to exist together, thereby constructing the whole logic, particularly the connection of the CMOS logical gate to the BiCMOS logical gate, the dimension of the gate width of the transistor, and device layout.

BACKGROUND OF THE INVENTION

A general CMOS semiconductor integrated circuit (hereinafter referred to as "CMOSLSI") is shown in FIG. 1, and FIG. 2 is a conventional BiCMOS semiconductor integrated circuit (hereinafter referred to as "BiCMOSLSI").

For the conventional BiCMOSLSI, in CMOSLSI, a CMOS logical gate circuit 25 in a position where a high load capacity is driven is replaced with a BiCMOS logical gate circuit 26 to enhance the load driving ability of a gate for driving a high load capacity, offering acceleration.

In the design of semiconductor integrated circuits, in order to simplify the design, it is common practice to use a method wherein a logical macro library containing a large variety of logical macros for realizing various logical functions is provided and the logical macros are connected by automatic programmed disposition/wiring or by manual disposition/wiring to realize a desired logical function.

FIG. 3 shows one example of a circuit wherein an inverter is constructed by a BiCMOS logical gate circuit (Japanese Patent Application No. 78297/1994).

The circuit comprises: a first NPN bipolar transistor (hereinafter referred to as "NPN transistor") 27 comprising a collector connected to a high-potential power source (hereinafter referred to as "VCC") 1 and an emitter connected to an output terminal 4; a second NPN transistor 28 comprising a collector connected to an output terminal 4 and an emitter connected to a low-potential power source (hereinafter referred to as "GND"); a P channel MOS transistor (hereinafter referred to as "PMOS") 29 comprising a source connected to VCC1, a drain connected to the base of the first NPN transistor 27, and a gate connected to an input terminal 3; a first N channel MOS transistor (hereinafter referred to as "NMOS") 30 comprising a source connected to GND2 and a drain connected to the base of the first NPN transistor 27; a second NMOS 31 comprising a source connected to the base of the second NPN transistor 28, a drain connected to an output terminal 4, and a gate connected to an input terminal 3; and a resistance element 32 connected between the base of the second NPN transistor 28 and GND 2.

The operation of the conventional BiCMOS logical gate circuit will be briefly described.

At the outset, the operation of the circuit in the case of transition of the input logical level from a high potential to a low potential will be described. When PMOS 29 is turned on and the first NMOS 30 is turned off, the base potential of the first NPN transistor 27 is increased and the first NPN transistor 27 is turned on, pulling up the potential of the output terminal 4. At the same time, NMOS 31 is turned off and the base potential of the second NPN transistor 28 is decreased by the resistor 32 to GND, causing the second NPN transistor 28 to be turned off. This prevents passing of current across the first NPN transistor 27 and the second NPN transistor 28. The above operation results in the transition of the output logical level from a low potential to a high potential.

Next, the operation of the circuit in the case of transition of the input logical level from a low potential to a high potential will be described.

PMOS 29 is turned off, and the first NMOS 30 is turned on. This causes the base potential of the first NPN transistor 27 to be decreased, and the first NPN transistor 27 is turned off. At the same time, the second NMOS 31 is turned on, and the second NPN transistor 28 is turned on, resulting in the transition of the output logical level from a high potential to a low potential.

One example of the circuit constant of the BiCMOS logical gate circuit will be described.

For the NPN transistors 27, 28, the emitter size is 1.2×12 $\mu$m, PMOS 29 has a gate length of 1.4 $\mu$m and a gate width of 20 $\mu$m, NMOS 30 has a gate length of 1.2 $\mu$m and a gate width of 5 $\mu$m, and NMOS 31 has a gate length of 1.2 $\mu$m and a gate width of 10 $\mu$m.

The voltage VGS applied to the second NMOS 31 is expressed by the following formula:

$$VGS=VIN-VBE$$

wherein VIN represents the input voltage and VBE represents the voltage across the base and the emitter of the second NPN transistor 28.

If the BiCMOS logical gate circuit in question is driven by the BiCMOS logical gate circuit, the input voltage VIN is expressed by the following formula:

$$VIN=VCC-VBE$$

wherein VIN represents the input voltage and VCC represents the power source voltage. Therefore, VGS=VCC−2VBE.

Lowering the power source voltage VCC is a technical trend in recent years. In this case, however, as can be seen from the above formula, the VGS applied to the second NMOS 31 is rapidly lowered. In order to satisfactorily shorten the time taken for charging of the base of the second NPN transistor 28, it is necessary to maintain the drain current of the second NMOS 31 on a satisfactorily high level. Lowering the power source voltage VCC for this purpose necessitates satisfactorily increasing the gate width of the second NMOS 31.

This, therefore, renders the input capacity of the BiCMOS logical gate circuit very large. When the BiCMOS logical gate circuit is driven by the CMOS logical gate circuit, the input high level is equal to VCC. This reduces the above influence. Even in this case, the influence is not completely eliminated.

When the input capacity of the BiCMOS logical gate circuit is determined in the large load drive position, the input capacity of the CMOS logical gate circuit is usually made equal to the input capacity of the BiCMOS logical gate circuit. The reason for this is as follows. When the input capacity of the CMOS logical gate circuit is smaller than the input capacity of the BiCMOS logical gate circuit, the delay time in the case of driving of BiCMOS logical gate circuit from CMOS logical gate circuit becomes large. On the other hand, even when the input capacity of the CMOS logical gate circuit is made larger than the input capacity of the BiCMOS logical gate circuit, the delay time cannot be sufficiently shortened, posing significant problems such as increased power consumption and lowered integration density.

It is well known that the power consumption is governed by power for charge and discharge of parasitic capacity of the MOS transistor and, hence, proportional to the gate width. Further, when the wiring between the logical gates is satisfactorily short, the delay time of the CMOS logical gate circuit does not depend upon the gate width of the MOS transistor used. The reason for this is that the travel time for carrier immediately under the gate does not depend upon the gate width and, further, the charge/discharge time for parasitic capacity too does not depend upon the gate width. That the charge/discharge time for parasitic capacity too does not depend upon the gate width can be easily understood from the fact that all the drain current, gate capacity, and source and drain diffusing capacity are proportional to the gate width.

In the conventional BiCMOSLSI, when a BiCMOS buffer section is used for driving large load, such as inter-macro capacity, the gate width of the CMOS logical gate circuit for driving it should be increased because the input capacitance of the BiCMOS buffer is large. In particular, when the power source voltage is low, this tendency is significant.

Therefore, there is a drawback that wasteful power consumption for charge and discharge of gate capacity, diffusion capacity or the like occurs within macros where wiring capacity or the like can be negligible. Further, the size of the MOS transistor is large, and the integration of the bipolar transistor together with the MOS transistor has rendered the integration density smaller than that of CMOSLSI.

SUMMARY OF THE INVENTION

An object of the present invention is to realize, in BiCMOS logical LSI, a higher integration density than that of the CMOS logical LSI and a lower power consumption than that of the CMOS logical LSI.

According to the present invention, there is provided a BiCMOS logical integrated circuit comprising a BiCMOS logical integrated circuit in combination with a CMOS logical gate circuit, wherein at least one of NMOS and PMOS constituting the CMOS logical gate circuit has one contact having a minimum dimension acceptable in design criteria in a diffusion layer and the gate width thereof is determined by the sum of the acceptable minimum dimension and the acceptable minimum distance from the outer periphery of the contact to the outer edge of the diffusion layer.

In the CMOS logical section, a high operating speed can be realized by satisfying requirements that the diffusion layer of the NMOS transistor constituting the CMOS logical gate circuit has one contact having a minimum dimension acceptable in design criteria, the gate width thereof is determined by the sum of the acceptable minimum dimension and the acceptable minimum distance from the outer periphery of the contact to the outer edge of the diffusion layer, and the gate width of the PMOS transistor is twice that of the NMOS transistor.

Further, when the input capacity of the BiCMOS logical gate circuit is made equal to that of the CMOS logical gate circuit, no increase in delay time occurs in the driving of BiCMOS logical gate circuit by the CMOS logical gate circuit.

In one embodiment of the BiCMOS logical gate circuit, a bipolar transistor for pull up of the output and a bipolar transistor for pull down of the output are connected to each other in a multi-layer form (totem-pole connection), and MOS for driving the base of the transistor for pull up of the output and regulating the conductive state of the base and MOS for driving the base of the transistor for pull down of the output and regulating the conductive state of the base are provided.

For the transistor for pull up of the output and the transistor for pull down of the output, there are three cases where the transistors are both NPN type, respectively NPN type and PNP type, and respectively PNP type and NPN type. When a plurality of logical function blocks are combined either horizontally or hierarchically to realize the whole logical function and, further, the BiCMOS logical gate circuit is used in only the output section of the logical function block, what is required of the BiCMOS logical gate circuit is to drive a small CMOS logical gate circuit which is an input for other logical macros, minimizing the fan-out delay.

Further, when the BiCMOS logical gate circuit has a base potential fixing circuit, the off-state of pull-up or pull-down bipolar can be stably brought to a near-on off state. Furthermore, the current which flows into the base potential fixing circuit can be reduced by making the impedance in the current passage in the base potential fixing circuit between the base and emitter terminals for the both bipolar transistors higher than the input impedance of the base terminal in the bipolar transistor for pull up of the output or pull down of the output.

When a power source having a higher voltage than the power source VCC connected to the bipolar transistor is used as the power source of the MOS transistor for driving the base of the transistor for pull up of the output and regulating the conductive state of the base, it becomes possible to pull up the output voltage of the BiCMOS logical gate circuit to around VCC.

DETAILED DESCRIPTIONS OF PREFERRED EMBODIMENTS

Figure 1:
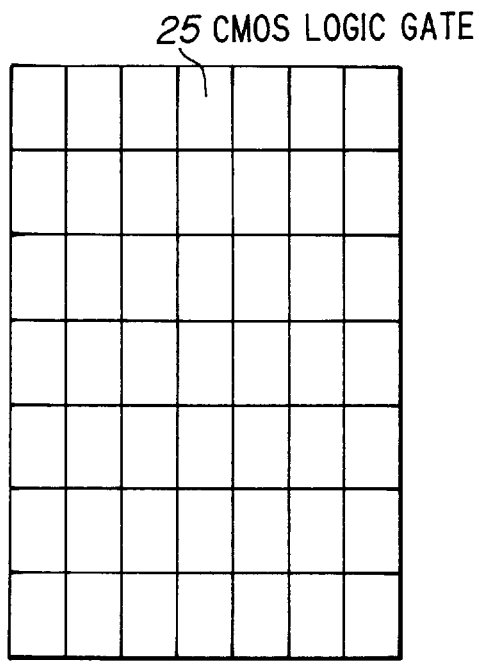
FIG. 1 is a schematic plan view showing the layout of a general CMOS logical LSI.
Figure 2:
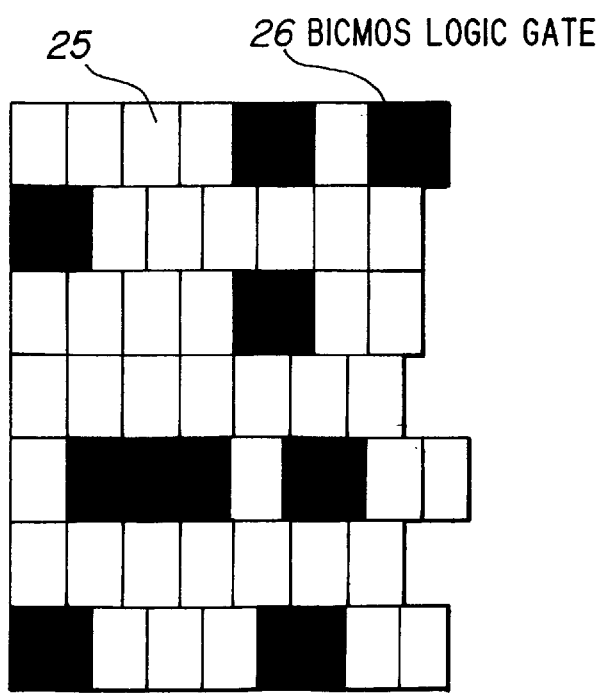
FIG. 2 is a schematic plan view showing the layout of a conventional CMOS logical LSI.
Figure 3:
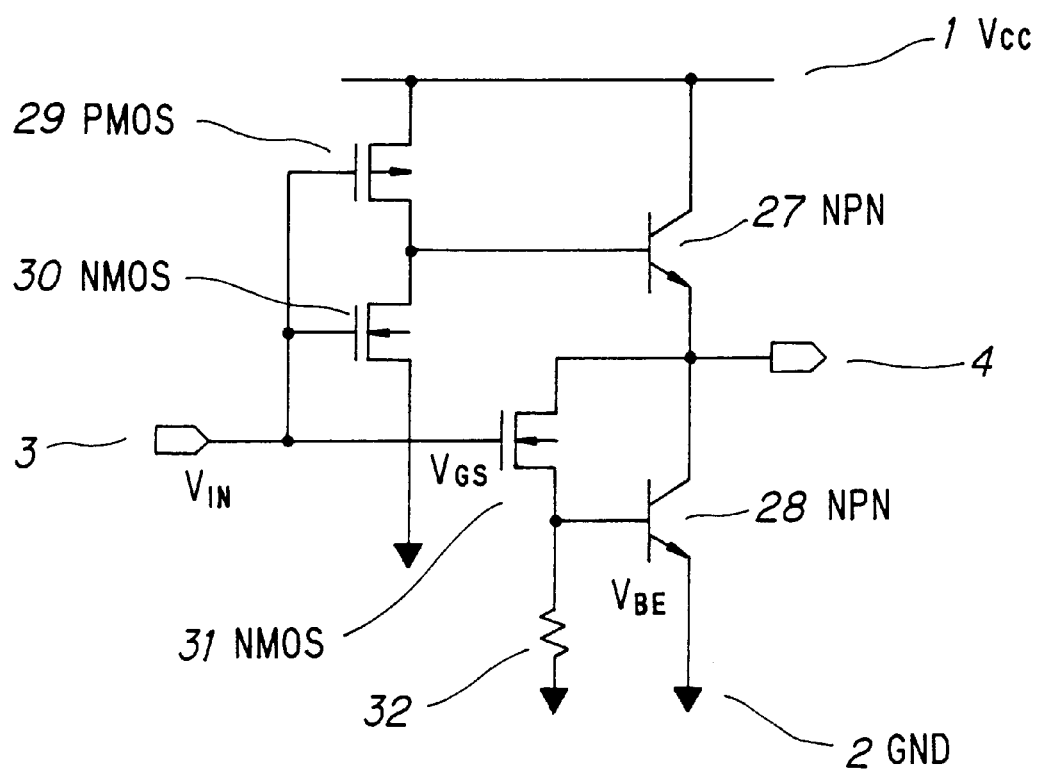
FIG. 3 is a circuit diagram showing a conventional BiCMOS logical gate circuit.
Figure 4:
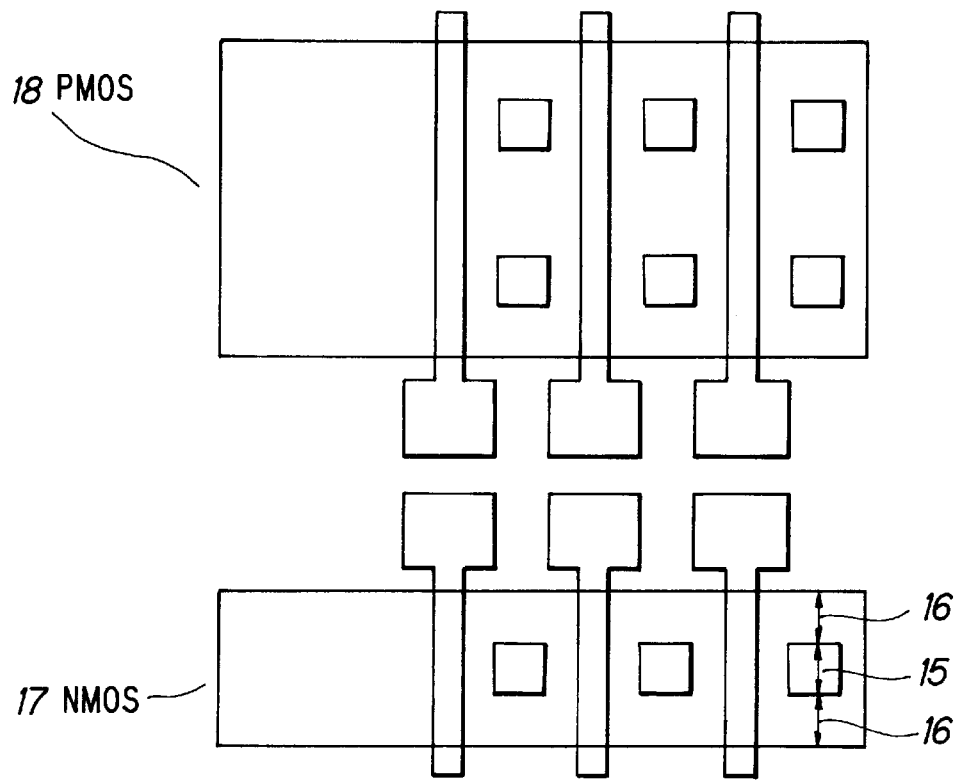
FIG. 4 is a circuit diagram showing a BiCMOS inverter used in the BiCMOS logical LSI according to the present invention.

Preferred embodiments of the present invention will now be described with reference to the accompanying drawings. FIG. 4 is a circuit diagram showing a BiCMOS inverter used in a semiconductor integrated circuit according to one embodiment of the present invention. This BiCMOS inverter per se is disclosed in Japanese Patent Application No. 237620/1993.

An NPN transistor for pull up of the output and an NPN transistor for pull down of the output are connected to each other in a multi-layer form, i.e., by the so-called "push-pull connection." Specifically, for NPN 5, the collector is connected to VCC 1 and the emitter is connected to an output terminal 4, while for NPN 6, the collector is connected to the output terminal 4 and the emitter is connected to GND 2.

Further, the base of the NPN transistor 5 is connected to the drain of PMOS 7, the drain of PMOS 7 is connected to the drain of a first NMOS 8, and an input terminal 3 is the gate of PMOS 7 and the gate of NMOS 8. The source of NMOS 8 is connected to the base of an NPN transistor 6. Further, for a second NMOS 9, the source is connected to the base of the NPN transistor 6, the drain is connected to the output terminal 4, and the gate is connected to the input terminal 3. A base potential clamp circuit 14 is connected to the base of the NPN transistor 6.

The base potential clamp circuit 14 comprises an NPN transistor 10 (e.g., bipolar 10) and first to third resistance elements. The first resistance element 11 is connected between VCC 1 and the base of the NPN transistor for pull down of the output 6. The second resistance element 12 is connected between the base of the NPN transistor 10 and the base of the NPN transistor 6. The third resistance element 13 is connected between the collector of the NPN transistor 10 and the base of the NPN transistor 6.

Next, the operation of the BiCMOS logical gate circuit will be briefly described.

At the outset, in the case of the transition of the input logical level from a high potential to a low potential, PMOS 7 is turned on, and the first NMOS 8 is turned off, supplying a base current to the pull-up NPN transistor 5 which pulls up the output potential. At the same time, the first and second NMOS 8, 9 are turned off to stop the supply of the base current to the second NPN transistor 6.

On the other hand, in the case of the transition of the input logical level from a low potential to a high potential, PMOS 7 is turned off, and the first NMOS 8 is turned on to pull down the base potential of the pull-up NPN transistor 5, causing the NPN transistor 5 to be turned off. At the same time, the first and second NMOS 8, 9 are turned on to cause the pull-down NPN transistor 6 to be turned on, pulling down the output logical level.

In this case, since the base potential of the pull-down NPN transistor 6 is fixed in the vicinity of base-emitter forward bipolar VBE by the base potential clamp circuit 14, there is no need for the first and second NMOS 8, 9 to charge the base parasitic capacity of the NPN transistor 6, so that the drain current may be very low and not gore than 100 µÅ. Therefore, the gate width of the first and second NMOS 8, 9 may be very small, and, when the gate length is 0.4 µm, the gate width may be set at, for example, 1 µm. Further, a satisfactory small emitter size may be set for the pull-up NPN transistor 5, or alternatively a cell aligning technique may be used to reduce the parasitic capacity of the base, enabling the gate width of PMOS 7 to be set at a small value. For example, the gate length is 0.5 µm, the gate width can be set at about 3 µm.

The operation of the clamp circuit will now be described. At the outset, the function of stably setting the clamp potential will be described.

In a steady state, the current which flows into the bipolar 10 of the clamp circuit is determined by the first resistance 11. The current value is set at not more than 100 µÅ. In this case, since the base current of the bipolar 10 is several µÅ, the voltage drop by the second resistance 12 (not more than about several kΩ) is on the order of mV and, hence, can be negligible. Therefore, the base potential of the pull-down bipolar 6 is equal to that of the bipolar 10.

Further, when the first NMOS 8 is turned on, the base potential of the pull-up bipolar 5, which is in an off state, is also clamped to as to be equal to the base potential of the bipolar 10. In this case, the current which flows into the pull-up bipolar 5, which is in an off state, and the pull-down bipolar 6, which is in a steady state, is equal to that in the bipolar 10 and very small, i.e., not more than 100 µÅ.

The temperature properties and variation derived from the production of $V_F$ can be compensated for by using a transistor having substantially the same size as the three bipolar transistors 5, 6, 10. Further, since the variation is not more than 100 mV, the variation in current in the steady state of the pull-up bipolar 5 and in the off state of the pull-down bipolar 6 depends upon only the variation derived from production and the temperature properties of the first resistance element 11 and can be suppressed on a satisfactorily low level, i.e., within 100 µÅ±30%. This enables the off-state of the pull-down bipolar 6 to be stably brought to a near-on off state.

In the present embodiment, the current which flows through the clamp circuit per se is limited in order to ensure the base current for the pull-down bipolar 6. When the first NMOS 8 and the second NMOS 9 are turned on, the on current is branched and flows into the bipolar 10 and the pull-down bipolar 6. In this case, the impedance of the passage of the current flowing through the clamp circuit is made higher than that for the pull-down bipolar 6. This prevents the current of the first NMOS 8 and the second NMOS 9 from flowing into the clamp circuit and aids the supply of that current to the base of the pull-down bipolar 6.

The CMOS logical gate used in the BiCMOSLSI of the present invention will be described. This CMOS logical gate comprises an MOS transistor having a very small gate width. Since these CMOS logical gate circuits are used in a section where the wiring capacity is small, such as the interior of the macro, there is no increase in delay of operation derived from a reduction in gate width.

The reason for this is as follows. When the wiring capacity is negligible as compared with the gate capacity and the source and drain diffusion capacity of the MOS transistor, the delay time of the CMOS gate does not depend upon the gate width used. This is because not only the on current but also the gate capacity and the source and drain diffusing capacity are proportional to the gate width.

When the wiring length is short such as found in the interior of relatively small logical macros, for example, the capacity of the 10-µm wiring is about 2 fF which is much smaller than 15 fF, the sum of the gate capacity and the source and drain diffusing capacity for PMOS having a 2-µm gate width and NMOS having 1-µm gate width.

Therefore, when the logical section consisting of the MOS transistor alone is designed in such a small gate width in a limited region, i.e., within logical function blocks, there is no deterioration in operating speed.

The input capacity of the BiCMOS logical gate circuit used in the macro output terminal is also so small that there is no increase in delay time in the driving of the BiCMOS logical gate circuit by the CMOS logical gate circuit.

Figure 7:
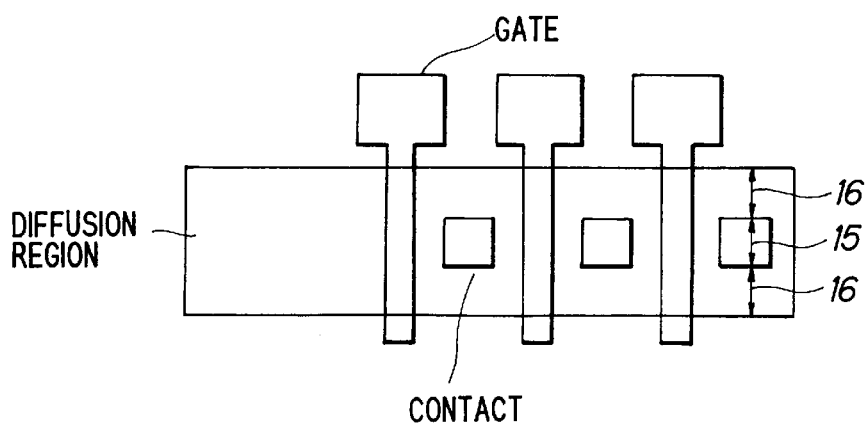
FIG. 7 is a schematic plan view showing the layout of the BiCMOS logical LSI according to the present invention.

The gate width of the MOS transistor used in the CMOS logical gate circuit is determined as follows. As shown in FIG. 7, the size 15 of the contact and the distance 16 between the contact and the outer edge of the diffusion layer are brought to the respective acceptable minimum dimensions. When both the size 15 and the distance 16 are 0.35 $\mu$m, the gate width is 0.35×3=1.05 $\mu$m. In this case, the power consumption of the CMOS logical gate circuit becomes minimum.

Further, as shown in FIG. 4, based on NMOS 17 having the acceptable minimum gate width, the ratio of the gate width of PMOS 18 to the gate width of NMOS 17 may be set at 2:1. Since the mutual conductance ratio of PMOS to NMOS is generally 1:2, the output rise time and the output fall time for the CMOS logical gate circuit in this case are balanced. Therefore, the operating speed of the CMOS logical circuit section is higher than that in the embodiment described above.

Further, when the input capacity of the BiCMOS logical gate circuit is made equal to the input capacity of the CMOS logical gate circuit, there is no increase in delay time in the driving of the BiCMOS logical gate circuit by the CMOS logical gate circuit.

Figure 5:
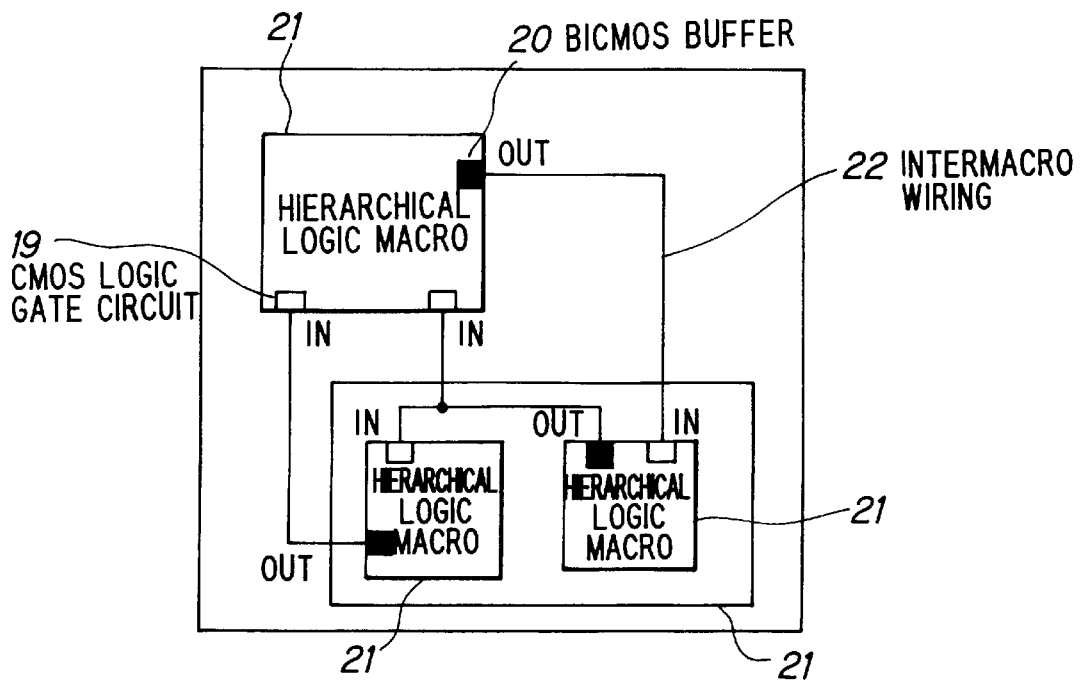
FIG. 5 is a layout plan view showing the dimension of a MOS transistor according to one embodiment of a BiCMOS inverter used in the BiCMOS logical LSI according to the present invention.
Figure 6:
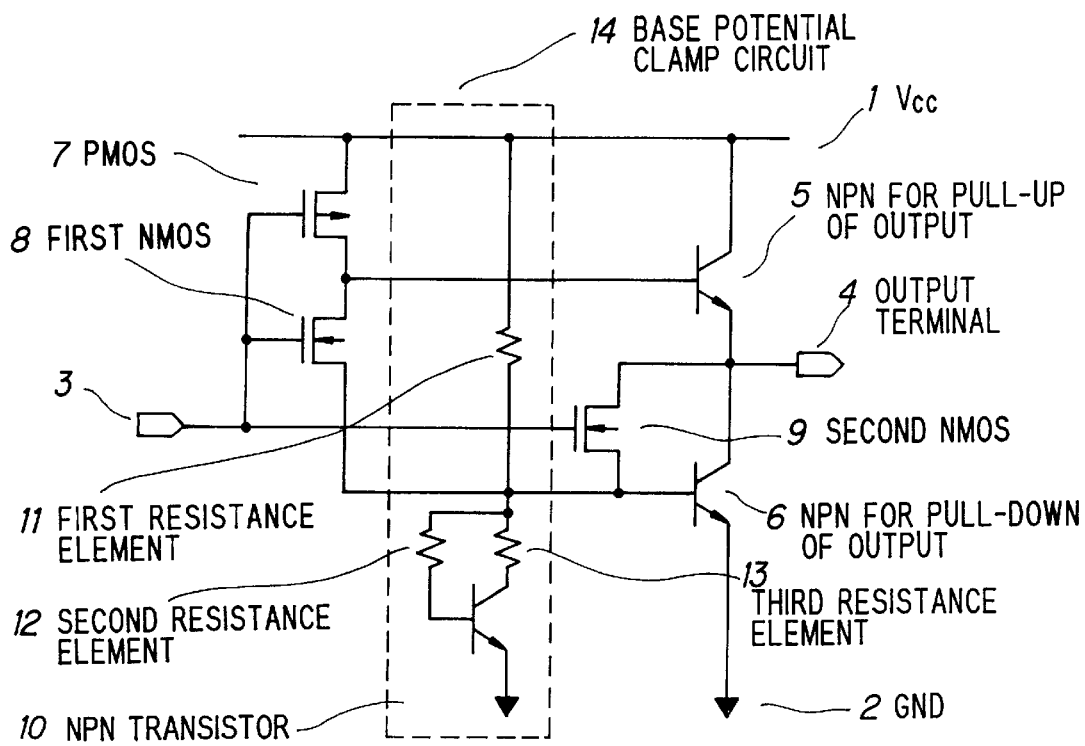
FIG. 6 is a plan view of a layout showing the dimension of a MOS transistor according to another embodiment of a BiCMOS inverter used in the BiCMOS logical LSI according to the present invention.

Further, in the MOS transistor layout patterns shown in FIGS. 5 and 6, the gate width of the transistor wherein two MOS transistors which share a source diffusing region are connected in parallel to each other is twice that of the MOS transistor having the minimum dimension. In this case, however, the area and the peripheral length of the source diffusing region are smaller than those in the case where the realization of the same gate width in a single transistor is contemplated. Therefore, a combination of minimized increase in power consumption with high speed operation can be realized. The use of this embodiment in the CMOS logical circuit section and the BiCMOS logical gate circuit section can realize a high-speed LSI while minimizing the increase of the power consumption.

Further, when all the gate circuits driven by the BiCMOS buffer are a CMOS logical gate circuit, the VGS applied to the first and second NMOS 8, 9 is equal to VCC-VBE, enabling the power source voltage to be made lower than that in BiCMOSLSI having a portion where the BiCMOS logical gate circuit drives the BiCMOS logical gate circuit.

FIG. 7 is a layout diagram showing the construction of the BiCMOSLSI according to the present invention.

In this embodiment, a plurality of CMOS logical gate circuits 19 comprising an MOS transistor having a very small gate width and a plurality of hierarchical logical macros 21, of which the output terminal portion has been realized by a BiCMOS buffer 20 having a very low input capacity. Since the BiCMOS output buffer 20 drives the input terminal of other logical macro 21, that is, very small CMOS logical circuit 19, the fan-out delay becomes very small. Further, since most of the logical macros are constituted by the MOS transistor, the area of the logical macro 21 is small and, at the same time, the length of wiring between logical macros 21 is short. Both the wiring capacity and the wiring resistance become so small that the delay time in the intermacro wiring 22 driven by the BiCMOS output buffer 20 becomes very small.

When a BiCMOS logical gate using an MOS transistor having a small emitter size is used in the buffer, somewhat small driving current poses no problem because the effect of shortening the delay time, which can be attained by small wiring length and small input capacity of the fan-out CMOS logical gate circuit.

Therefore, the MOS transistor constituting the logical gate circuit is not only smaller than the conventional BiCMOS logical LSI but also can realize a higher integration density than that in the general high-speed CMOS logical LSI using a CMOS gate circuit which is usually required to ensure a 5 to 20-$\mu$m gate width for the purpose of ensuring the driving ability.

At the same time, the power consumption necessary for charge and discharge of the gate capacity of the MOS transistor and the source and drain capacity becomes so small that the BiCMOS logical LSI of the present invention has a higher integration density and a lower power consumption as compared with the conventional BiCMOS logical LSI and CMOS logical LSI.

In the present embodiment, although all the logic constituting sections in the logical macros are constituted by a CMOS gate circuit, a portion where the load is large due to fan-out, wiring or the like may be driven by a BiCMOS gate circuit to such an extent as will not lead to a lowering in the integration density.

Further, if necessary, a CMOS gate circuit wherein a plurality of MOS transistors having the minimum size are connected in parallel causing a slight increase in the gate width may be used in part of the logical macros.

Figure 8:
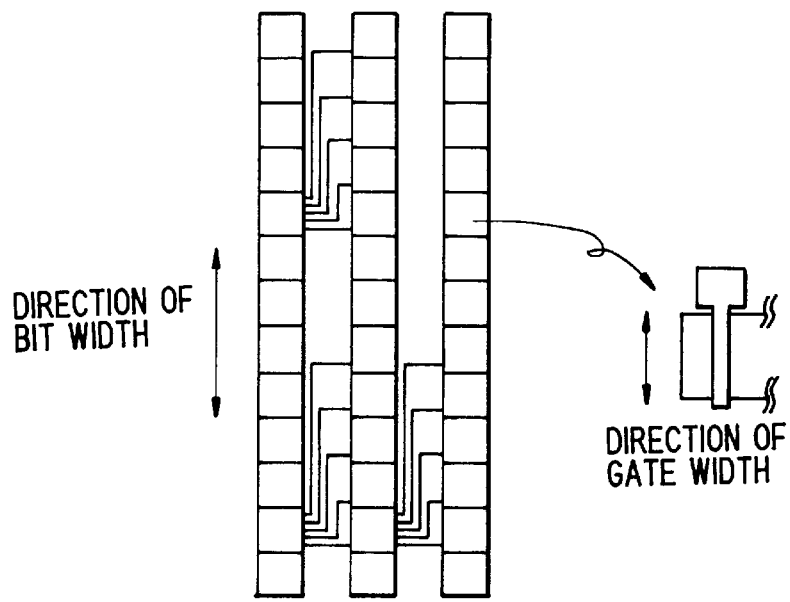
FIG. 8 is a schematic plan view showing the layout of a barrel shifter according to one embodiment of the BiCMOS logical LSI of the present invention.

The layout of a barrel shifter as an embodiment of layout in data buss or the like is shown in FIG. 8. In this embodiment, the gate width direction of the very small MOS transistor is allowed to coincide with the bit width direction of the data buss. This permits a reduction in gate width to directly contribute to a reduction in wiring length, minimizing the deterioration in operating speed caused by the reduction in gate width.

Figure 9:
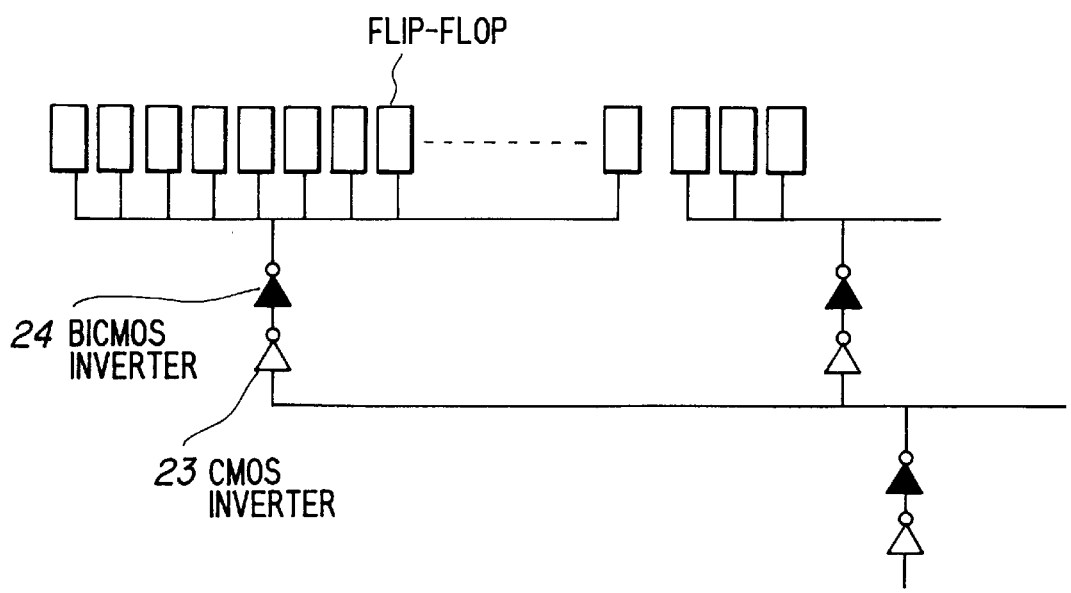
FIG. 9 is a circuit diagram showing a clock tree according to one embodiment of the BiCMOS logical LSI of the present invention.

FIG. 9 is a circuit diagram showing the clock signal distributing tree according to the present invention. In this embodiment, buffer circuits formed by connecting a CMOS inverter 23 having a very small gate width and a BiCMOS inverter 24 having a very small gate input capacity are connected to each other or one another in a tree form.

In the present embodiment, since the BiCMOS inverter 24 having a satisfactory driving ability drives the very small CMOS inverter 23, the number of fan-outs may be large. For example, since the gate input capacity of the BiCMOS logical gate circuit shown in FIG. 4 is about ⅙ of that of a CMOS logical gate circuit having a comparable driving ability, when the input capacity of the very small CMOS logical gate circuit is made equal to that of the BiCMOS logical gate circuit, the rise waveform and the fall waveform can be maintained even in the connection of fan-outs of which the number is 6 times the number of fan-outs in the clock tree. Therefore, the number of clock buffers can be greatly reduced while suppressing the clock skew on a small level, enabling the improvement of the integration density and the improvement of the power consumption.

Further, in the present embodiment, since the BiCMOS inverter always drives the CMOS inverter, as described about, the VGS applied to the first and second NMOS 8, 9 of the BiCMOS inverter becomes equal to VCC-VBE, facilitating the lowering of the power source voltage.

Figure 10:
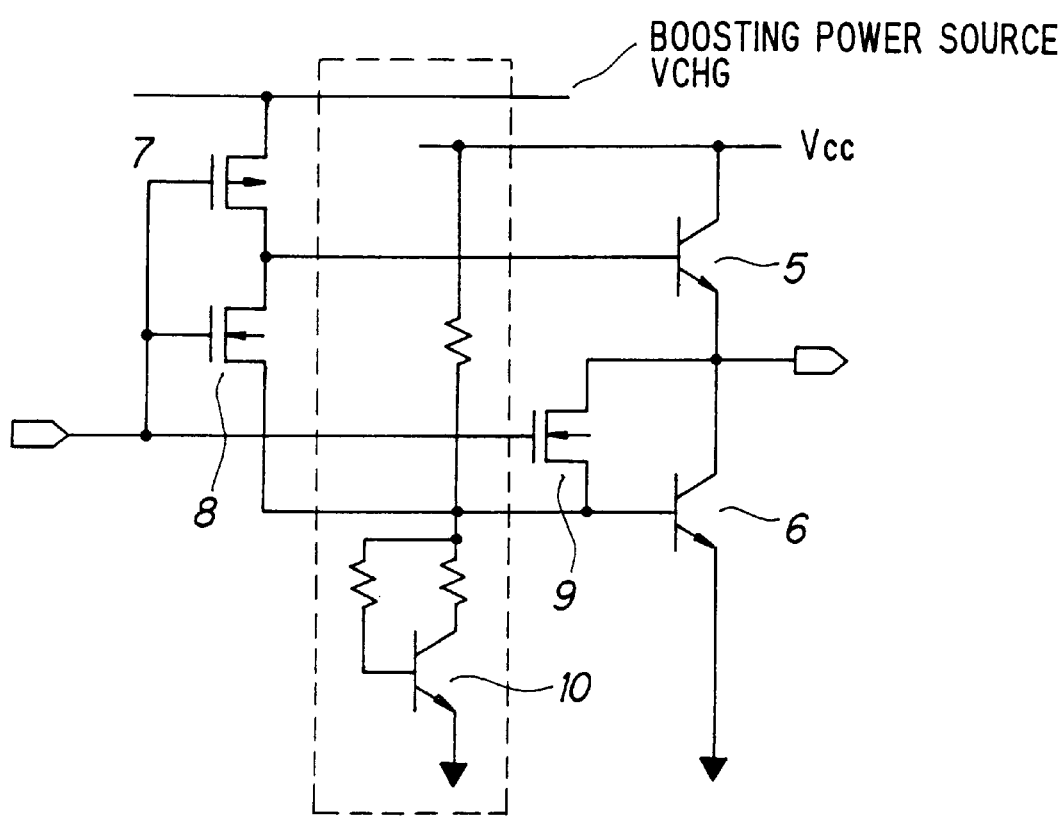
FIG. 10 is a circuit diagram showing another embodiment of a BiCMOS inverter used in the BiCMOS logical LSI of the present invention.

Further, as shown in FIG. 10, a power source boosted by a charge pump circuit or the like or an external power source, which Is separately provided from VCC, may be connected to the source of PMOS 7 in the BiCMOS logical gate circuit shown in FIG. 4 to pull up the output potential of the BiCMOS logical gate circuit to around the potential of VCC.

When the potential of VCHG is set at a potential which is about 0.6 V higher than the potential of VCC, 0.2 to 0.3 V is ensured across the collector and the emitter of the pull-up bipolar 5, enabling the output potential to be pulled up to around the potential of VCC without saturation. In other words, VCHG is preferably set so that the difference between the pulled up potential and the potential of the VCC is not less than the saturated voltage across the collector and the emitter of the pull-up bipolar 5. The NPN bipolar generally has a high current amplification factor of about 50 to 100, and the base current for the first bipolar 5 is supplied only when the output voltage is pulled up. Therefore, the current driving ability of the charge pump for setting the potential of VCHG may not be large. Further, VCHG can be supplied to a large number of BiCMOS gate circuits by a single charge pump circuit. For the construction of this circuit, the applicant of the present application has already filed a patent application (Japanese Patent Application No. 78297/1994).

The use of the above BiCMOS logical gate circuit enables the BiCMOS logical gate circuit to drive a BiCMOS logical gate.

Figure 11A:
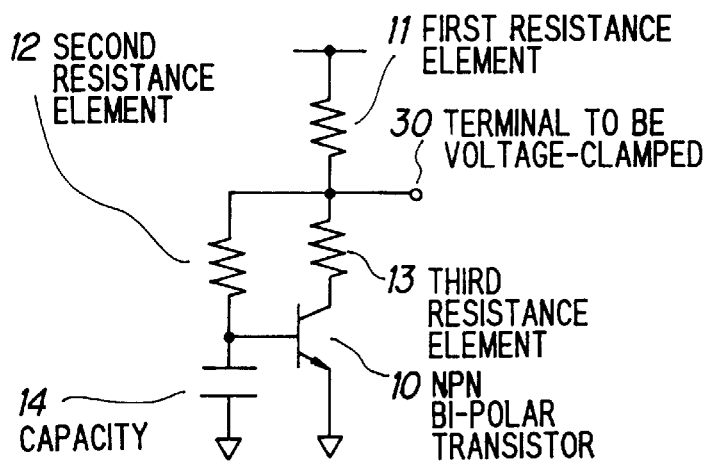
FIGS. 11A to 11E are circuit diagrams showing various embodiments of a clamp circuit used in the present invention.
Figure 11D:
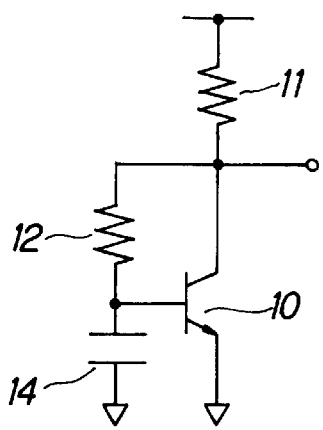
Figure 11B:
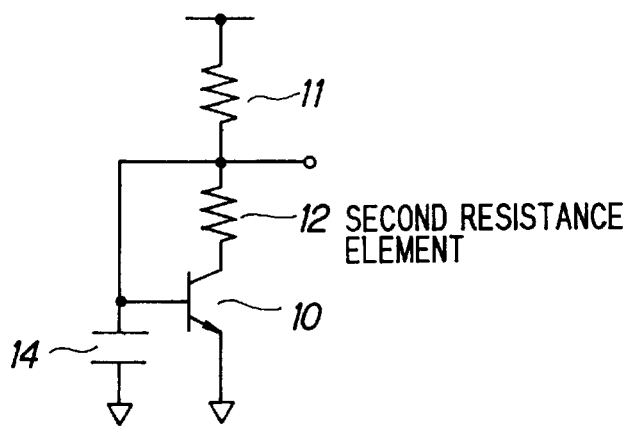
Figure 11E:
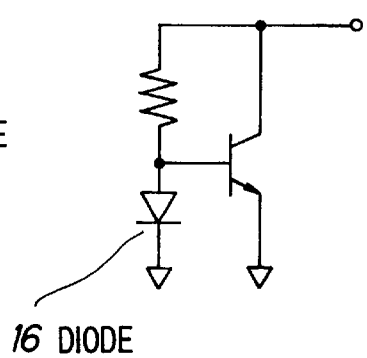
Figure 11C:
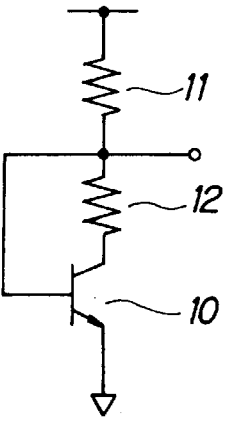

Various clamp circuits are shown in FIGS. 11A to 11E. FIG. 11A shows an embodiment where a capacity element 14 is added to delay the transient response time. FIG. 11B shows an embodiment where the resistance element 12 between the base and the terminal 30 to be subjected to voltage clamp (clamp terminal) has been removed from the circuit shown in FIG. 11A to conduct short circuiting. FIG. 11C is an embodiment where the resistance element 12 between the gate and the clamp terminal has been removed from the embodiment shown in FIG. 4. FIG. 11D is an embodiment where the resistance element 13 between the collector and the clamp terminal 30 has been omitted from the circuit shown in FIG. 11A. FIG. 11E is an embodiment where the resistance element 12 has been removed and a diode 16 has been provided instead of the capacity element 14. In short, since the provision of a resistance element on either base side or collector side of the bipolar transistor results in increased impedance with respect to the clamp terminal, the position and the number of the resistance element and the capacity provided may be properly determined depending upon other conditions of the circuit.

In the present embodiment, both the pull-up and pull-down bipolar transistors are of NPN type. In the present invention, however, one of the pull-up and pull-down bipolar transistors may be of NPN type with the other being of PNP type. Further, in the present embodiment, the gate width of NMOS has a minimum value. In the present invention, however, PMOS is also possible, and, further, both NMOS and PMOS are also possible.

As described above, a BiCMOS logical gate circuit having a very small input capacity is combined with an MOS transistor having a very small gate width to constitute a logical LSI. This constitution can realize BiCMOSLSI which has a combination of high speed with a lower power consumption than the CMOS logical LSI and a higher integration density than CMOS.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A BiCMOS logical integrated circuit, comprising:
   a BiCMOS logical gate circuit; and
   a CMOS logical gate circuit for driving the BiCMOS logical gate circuit,
   wherein either of NMOS and PMOS transistors in said CMOS logical gate circuit includes one contact of a first dimension provided in a diffusion layer and a gate having a width of a second dimension, said first dimension being a minimum dimension which is tolerable for a design standard, and
   wherein said second dimension is substantially equal to three times said first dimension of said contact.

2. The integrated circuit as defined in claim 1, wherein:
   a PMOS transistor in said CMOS logical gate circuit comprises a gate of width which is twice that of said NMOS transistor.

3. The integrated circuit as defined in claim 1, wherein:
   an input capacitance of said BiCMOS logical gate circuit is equal to that of said NMOS transistor.

4. The integrated circuit as defined in claim 1, wherein:
   said BiCMOS logical gate circuit comprises output pull-up and pull-down bipolar transistors vertically connected, and first and second MOS transistors, said first MOS transistor driving a base of said output pull-up bipolar transistor to be controlled in its conductive state, and said second MOS transistor driving a base of said output pull-down bipolar transistor to be controlled in its conductive state.

5. The integrated circuit as defined in claim 4, wherein:
   said output pull-up and pull-down bipolar transistors comprise NPN type bipolar transistors.

6. The integrated circuit as defined in claim 1, wherein:
   said BiCMOS logical gate circuit is used only for an output of a logical function block which is one of a plurality of logical function blocks combined in a horizontal and vertical manner to provide a whole logical function.

7. The integrated circuit as defined in claim 1, wherein:
   a direction of interconnections for said either of NMOS and PMOS transistors are orthogonal to a direction of a drain current flowing immediately under said gate of said either of NMOS and PMOS transistors.

8. The integrated circuit as defined in claim 4, wherein:
   said BiCMOS logical circuit comprises a base potential-clamping circuit, an impedance of a current path across base and emitter terminals of one of said output pull-up and pull-down bipolar transistors is higher than an input impedance of said base terminal of said one of said output pull-up and pull-down bipolar transistors.

9. The integrated circuit as defined in claim 8, wherein:
   said base potential-clamping circuit holds a base potential of an NPN bipolar transistor which is at least one of said output pull-up and pull-down transistors to a potential substantially equal to a base emitter forward voltage of said NPN bipolar transistor.

10. The integrated circuit as defined in claim 8, wherein:
    said output pull-up bipolar transistor is an NPN transistor; and
    said base potential-clamping circuit holds a base potential of said NPN transistor to a potential of a base emitter forward voltage of said NPN transistor.

11. The integrated circuit as defined in claim 1, wherein:

said output pull-up bipolar transistor is a PNP transistor; and said base potential-clamping circuit holds a base potential of said PNP transistor to a potential of a base emitter forward voltage of said PNP transistor.

12. The integrated circuit as defined in claim 4, wherein: said first MOS transistor is supplied with a power from a power supply of a voltage which is higher than that for said output pull-up and pull-down bipolar transistors.

13. The integrated circuit as defined in claim 1, wherein at least said CMOS logical gate circuit is located in a macro driven by said BiCMOS logical gate circuit.

* * * * *